Oct. 14, 1969 K. LEHOVEC 3,473,032

PHOTOELECTRIC SURFACE INDUCED P-N JUNCTION DEVICE

Filed Feb. 8, 1968 2 Sheets-Sheet 1

Oct. 14, 1969 K. LEHOVEC 3,473,032

PHOTOELECTRIC SURFACE INDUCED P-N JUNCTION DEVICE

Filed Feb. 8, 1968 2 Sheets-Sheet 2

United States Patent Office 3,473,032
Patented Oct. 14, 1969

3,473,032

PHOTOELECTRIC SURFACE INDUCED P-N JUNCTION DEVICE

Kurt Lehovec, Williamstown, Mass., assignor to Inventors and Investors, Inc., Williamstown, Mass., a corporation of Massachusetts Filed Feb. 8, 1968, Ser. No. 703,958
Int. Cl. H01j *39/12*
U.S. Cl. 250—211 8 Claims

ABSTRACT OF THE DISCLOSURE

Photo emitting or else photosensitive devices are constructed from the p-n junction between p- and n-regions induced in a high resistivity semiconducting body by means of electric fields applied between said body and electrode pairs separated from this body by an insulating film. Provisions are made for shifting the induced p- and n-regions in the underlying body to different positions for adaption to desired circuit functions.

Background of the invention

P-n junctions in semiconducting materials have found wide application as light sources and as light detectors. In general, the p-n junctions are made by appropriate chemical additions, so-called dopants, to the semiconducting body, e.g., antimony addition to silicon promotes n-type conduction, while aluminum addition to silicon causes p-type conduction. Once the chemical addition is made, e.g., by diffusing the dopant into portions of the semiconducting body at elevated temperatures, the principal features of the device are fixed, i.e., it is not possible to relocate reversibly the p-n junction between doped regions.

There are numerous applications where it is desirable to produce and erase p-n junctions reversibly to adapt the device temporarily to a desired circuit function. Consider, for instance, photoelectric registration of a movable light emitting object such as a rocket which traverses first through a point A and then through a point B in space. This task can be achieved by imaging the object on a planar surface of a semiconducting body and locating p-n junction light detectors at the images A′ and B′ of the points A and B. The present invention permits shifting the p-n junctions to a large number of points A′ or B′ on the semiconducting surface.

It is an object of this invention to provide a p-n junction in a semiconducting material whose position can be shifted reversibly by external means.

It is another object of this invention to provide a scanned light emitting device as might be used for a television camera.

It is another object of this invention to provide a scanned light receiving device as might be used for a television recording camera.

It is another object of this invention to provide a semiconducting circuit element in a geometrical pattern which can be reversibly changed by illumination to adapt the circuit element to different circuit functions.

Summary of the invention

This invention is based on the induction of p- and n-regions on a face of a high resistivity semiconducting body by means of electric fields of opposite polarity applied to the surface of the body. The high resistivity semiconducting body is obtained by absence of electrically active dopant impurities, or else, by simultaneous presence in about equal concentrations of complementary dopants, e.g., equal concentrations of Sb and Al in silicon. The electric fields are generated by applying suitable voltages between the semiconducting body and electrodes, usually metal stripes, separated from the semiconducting body by insulating films, such as silicon dioxide. In order, to produce a p-n junction two crossing metal electrode stripes might be used, one biased negatively and the other positively against the semiconducting body. The metal stripes are insulated against each other by an insulating film interposed between them at the crossing point. A variety of electrode configurations can be provided adjacent to a semiconducting substrate and the induced p-n junction can be shifted across the substrate in accordance with the particular electrode configuration which is electrically activated.

The electric activation can be achieved by a variety of means, including changing the potential applied to the electrode configuration, illumination of a photosensitive portion of the electrode configuration, and an electrically active electrode configuration such as a flip-flop. Physical removal of one electrode configuration and replacement by another one can be used also to change the induced p-n junction configuration.

The induced charge layers in the semiconductor terminate in contact areas, e.g., metal contacts to the semiconductor or chemically doped areas provided with metal contacts, which permit application of electrical power and provide electrical connection to other circuitry.

By applying a suitable bias voltage to the induced p-n junction, light emission from the p-n junction can be generated, or else the p-n junction can be used as a photosensitive circuit element. The induced p-n junction circuit can be coupled electrically or photo-electrically with the circuit encompassing the electrode configuration by which the p-n junction is induced.

After applying a field to the semiconducting surface, a certain time is required for the build-up of the induced charge. This time can be reduced by suitable illumination of the semiconducting substrate and this feature of the invention can also be exploited for various circuit functions.

Description of the preferred embodiment

Figures 1, 5:
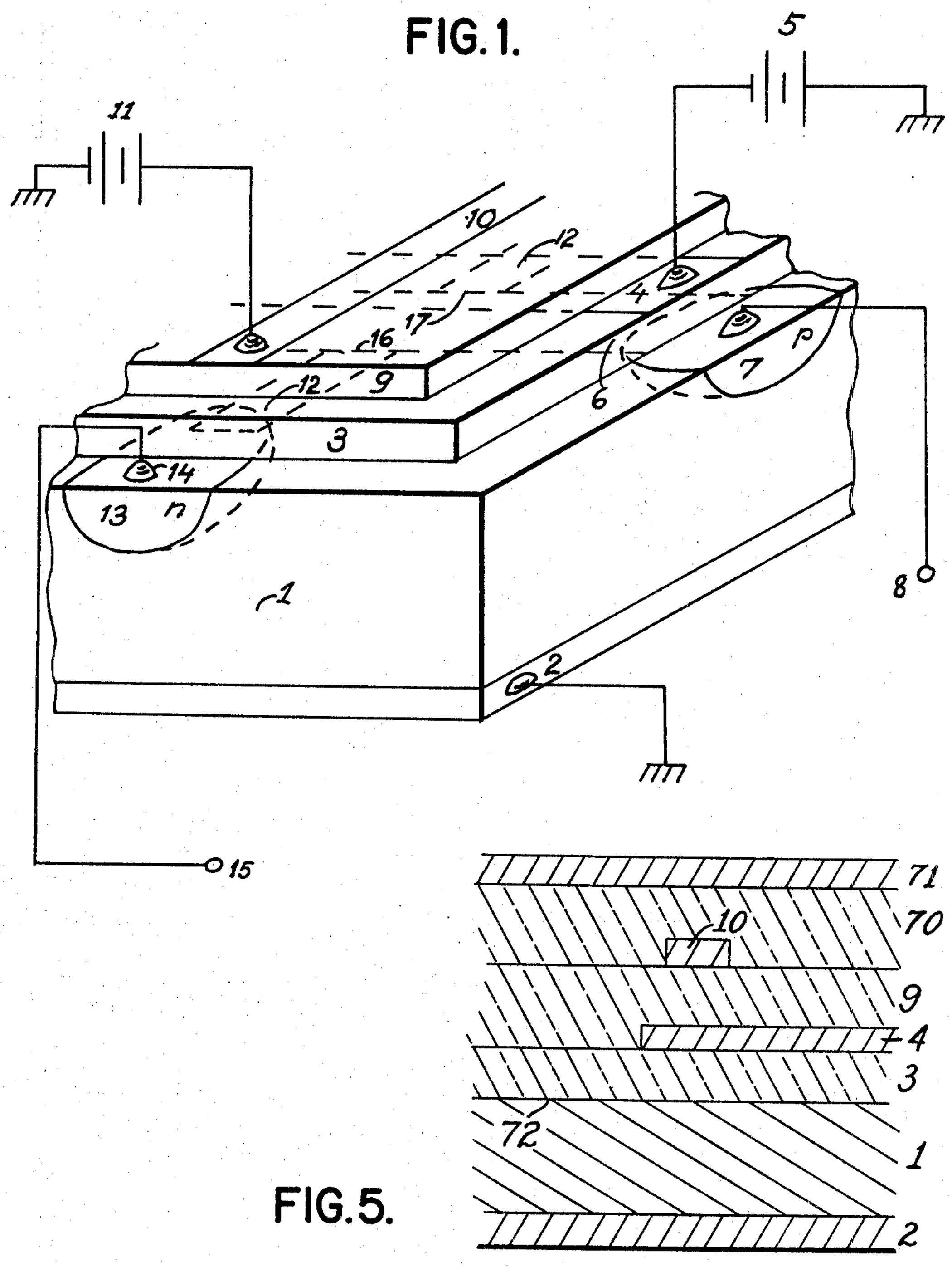
FIGURE 1 illustrates a semiconducting slab according to this invention with provisions to induce p- and n-zones in the surface region of the semiconductor.
FIGURE 5 illustrates means to eliminate undesired induced conduction which might arise from interface charges or insulator charges.

FIGURE 1 shows a semiconducting body 1 provided with a contact 2 on one face and coated by an insulating film 3 on the opposite planar face. The insulating film carries a metallized electrode 4 which is biased negatively by the power supply 5 against the semiconducting body 1. This negative bias induces a positive charge layer 6 in the semiconducting body 1 adjacent to its interface with 3, to which contact is made by the chemically doped p-region 7 connected to the external terminal 8.

A second insulating layer 9 is deposited on top of the first insulating layer 3 covering the electrode 4 and insulating it against an electrode 10 positioned on top of the layer 9. The electrode 10 is given a positive bias voltage against the contact 2 to the semiconducting body 1 by means of the power supply 11. This positive bias induces the n-layer 12 in the semiconducting body 1 adjacent to its interface with the insulating layer 3. A chemically doped n-type layer 13 carries the contact 14 which connects the induced n-type layer 12 to the external terminal 15. Two p-n junctions 16 and 17 are thus formed between the p-layer 6 and the n-layer 12. The p-n junction 16 can be used as a photovoltaic element by illuminating the adjacent portion of the semiconducting body with light producing electron-hole pairs, causing the terminal 15 to become negative and the terminal 8 to become positive. Or else, an external bias can be applied between 15 and 8, e.g., positive to 15 and negative to 8, biasing the p-n junction 16 in the blocking direction and using the photocurrent between 15 and 8 as an indication for the illumination of the junction area. However, the bias applied to 15 must be less positive than that to 10 (both biases measured with respect to contact 2) and the bias applied to 8 must be less negative than that to 4, in order that the n-region 12 and p-region 6 are maintained. Still another application of the arrangement shown in FIG. 1 is obtained if one applies a negative bias to 15 and a positive bias to 8, thus driving a forward current through the p-n junction 16, which leads to light emission by recombination of electron-hole pairs. Intensity of the emitted light can be governed by the magnitude of the bias voltage between 15 and 8.

Figure 2:
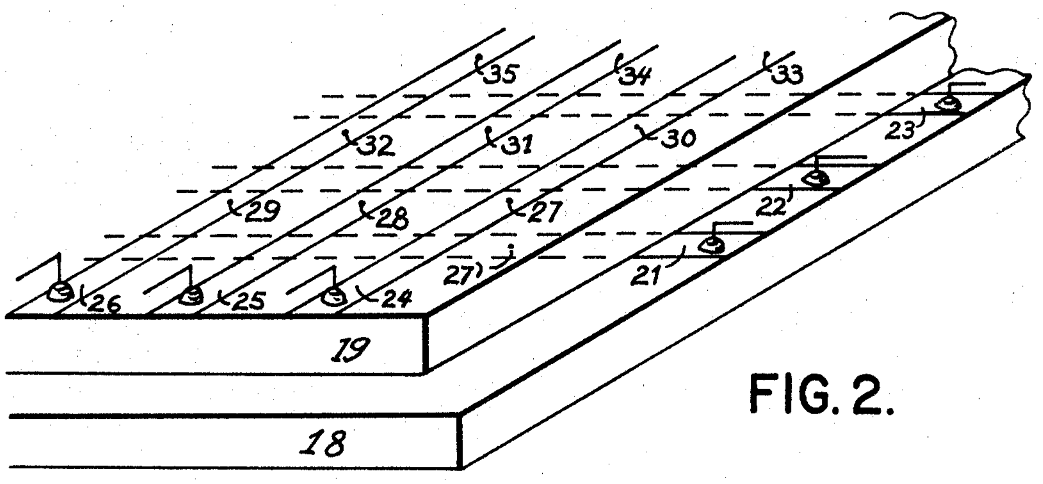
FIGURE 2 illustrates a multitude of contact stripes as might be used for scanning purposes.

Instead of using only two electrodes 4 and 10 to induce charge layers in the semiconducting body, a multiplicity of electrodes can be used. An example is illustrated in FIG. 2. FIGURE 2 represents a section of a device according to this invention, this section corresponding to the insulating layers 3 and 9 with a multiplicity of electrodes such as 4 and 10 in FIG. 1.

The insulating film 18 in FIG. 2 carries a first set of electrodes 21, 22, 23 on its upper surface. There is a second insulating film 19 with a second set of electrodes 24, 25, 26 on its upper surface. Points on the electrodes 24, 25 and 26 lying above the stripes 21, 22 and 23 are numbered 27 through 35. The projection of the point 27 onto the underlying electrode 21 is indicated by 27'. Projection of points 28–35 on the underlying electrodes 21–23 have not been marked. The arrangement of FIG. 2 is to be placed on the top of a high resistivity semiconducting slab such as 1 in FIG. 1.

Consider now the special case that a negative bias is applied to 21 and a positive bias applied to 24 with respect to the semiconducting slab as ground or zero level. This induces a p- and n-region in the semiconducting slab with a p-n junction near the projection of the cross over point 27 onto the semiconducting surface. Next, switch the positive bias to 25 while maintaining the negative bias at 21. This shifts the induced p-n junction to a new position, located adjacent to 28. Similarly, a switch of the positive bias to 26 shifts the junction to a position adjacent 29. Switch now the positive bias back to 24 and simultaneously the negative bias to 22. This locates the induced p-n junction adjacent the position 30. While the negative bias is applied to 22, a positive bias is applied to the electrode 21 in order to maintain an induced n-layer adjacent to 27 where the semiconducting body is shielded from the electrode 24 by the electrode 21. Thus, it is advisable to bias all the bottom electrodes 21 to 23 in the same polarity as the top electrodes 24 to 26 except of one bottom electrode which has the opposite polarity.

The electrode configuration of FIG. 2 illustrates the possibility to shift induced p-n junctions reversibly by application of external potentials to anyone of a large number of positions 27 to 35 on a semiconducting surface. Moreover, by using clock circuits to shift the bias voltages to the inducing electrodes, the semiconducting surface can be scanned with induced p-n junction elements. Since a p-n junction can be used both as a light detector, or else as a light emitter, depending on bias conditions, the arrangement just described is useful as a television pick-up camera and also as a television picture "tube." The former utilizes the photocurrent extracted from the illuminated induced p-n junction. The latter uses a current passed through the induced p-n junction to achieve the desired level of light intensity.

In general, the inducing circuit such as shown in FIG. 2 will be rigidly attached to the underlying semiconducting body 1 and insulating spacer film 18. However, in certain cases, it might be advisable to produce the inducing circuit as a physically separate part, permitting exchange of several different inducing circuits on a given piece of semiconducting substrate.

Figure 3:
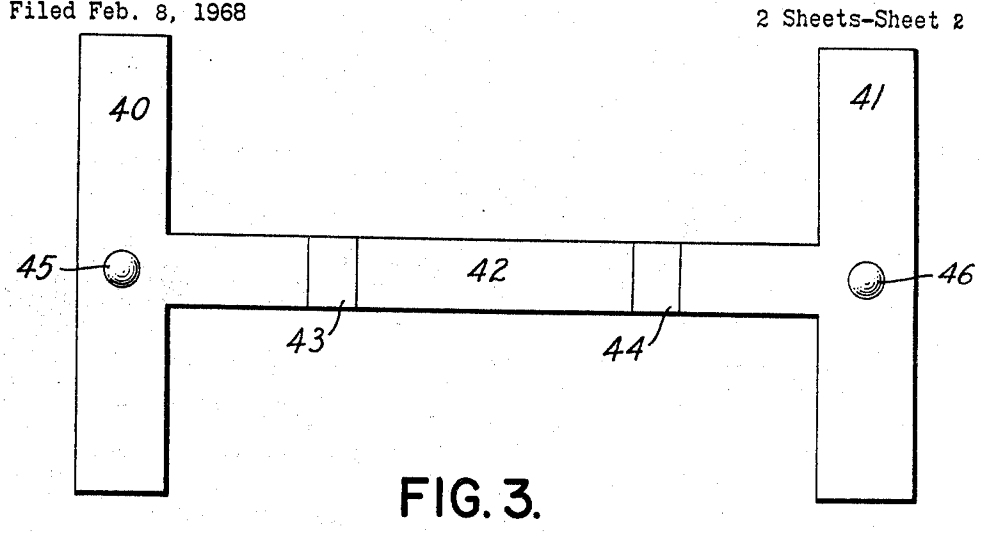
FIGURE 3 illustrates an electrode arrangement which can be activated optically.

FIGURE 3 illustrates a top view of an electrode configuration which can be activated by illumination. The electrode configuration shown in FIG. 3 should be considered to lie on top of the insulating film 3 in FIG. 1, which covers the semiconducting body 1. The electrode configuration of FIG. 3 consists of three metallized sections 40, 41 and 42 separated by two gaps which are bridged by high resistivity photoconducting films 43 and 44 of a material such as CdS. Provisions are made to apply bias voltages to the outer metallized regions 40 and 41 by means of terminals 45 and 46.

Suppose a positive bias of 10 volts is applied to the metallized layer 40 and a negative bias of −10 volts to the metallized layer 41. Illumination of 43, but not 44, activates the photoconductor 43 and the metallized region 42 thus charges to about the same voltage as the electrode 40, i.e., +10 volts. Thus, a p-n junction will be induced in the underlying semiconducting substrate adjacent to 44, provided the gap between 42 and 41 is not much wider than the thickness of the insulator film separating the semiconductor from the electrodes 40, 41 and 42. Similarly, switching the illumination from 43 to 44 shifts the p-n junction in the semiconductor to a region adjacent to 43, since now 42 is charged to about the potential −10 volts of the electrode 41.

Thus, the electric circuit function in the semiconducting material can be modified by illumination of the inducing circuit shown in FIG. 3.

We may use the photosensitive inducing current of FIG. 3 as an illustration for a device according to this invention which encompasses interaction of the inducing circuit on the insulator and of the induced circuit in the semiconductor by means of radiation.

Suppose the induced p- and n-layers in the semiconducting substrate adjacent to the circuit of FIG. 3 are biased in such a manner that a radiation-emitting p-n junction arises; and suppose that the emitted radiation is able to render the photoconductors 43 and 44 conducting.

Starting with 43 in the conducting state, i.e., by brief external illumination, the light emitting junction in the substrate will be located adjacent 44. This light emission activates the photoconductor 44 while 43 has become insulating after removal of the initial external light pulse.

This shifts the light emitting p-n junction in the substrate to a position adjacent 43 and light emission from the region adjacent 44 ceases. Thus, the photoconduction in 44 is decaying and the potential drop between 40 and 41 shifts back to 44. As a result, the induced p-n junction and the light emission shifts back to the position adjacent 44, etc. Thus, we have here a flip-flop action. The frequency of switching between 43 and 44 depends on the rise and decay times of the photoconduction in 43 and 44 at the onset and after ceasing of illumination, respectively.

Figure 4:
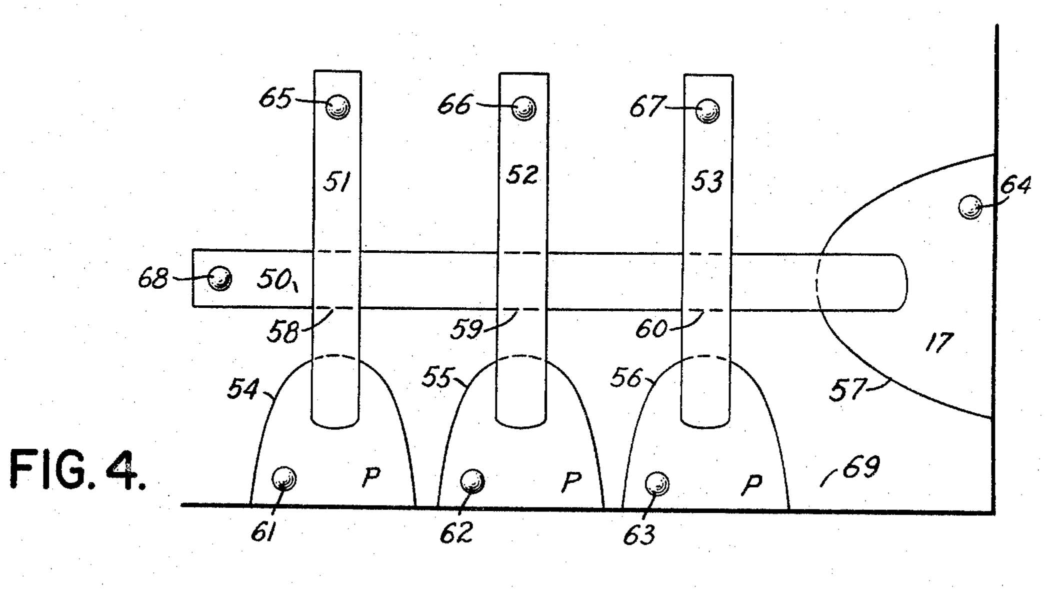
FIGURE 4 illustrates means to speed up the formation of the induced charge layers after application of the activating bias voltage by illumination of the semiconducting material.

The speed which a p- or n-region can be induced in the semiconductor after applying a bias voltage to an electrode outside of the semiconductor is of interest for some circuit performance. Immediately after applying the voltage, the field penetrates deeply into the semiconducting body. Eventually the field draws free charges, holes or electrons, as the case may be, toward the surface and generates an induced p- or n-layer. These free charges may originate by a number of different ways, including thermal generation of electron-hole pairs in the semiconducting body, production of electron-hole pairs by tunnel or avalanche processes if the applied field is sufficiently strong; injection of electrodes or holes from adjacent electrodes into the semiconducting body or from adjacent chemically doped layers. Since thermal generation of electron-hole pairs requires a finite time, there may not be sufficient time for the establishment of an induced p-n junction in the underlying semiconducting body during the period at which the bias voltages are maintained on a given pair of electrodes such as shown in FIG. 2. However, the speed of establishment of the induced p- or n-layer can be increased by illuminating the semiconductor with radiation generating electron-hole pairs. Thus, by illuminating the semiconductor with a light pattern, a selection of activated induced layers can be achieved in accordance with the light pattern. This will be illustrated on hand of FIG. 4, which is a top view of an electrode arrangement consisting of a metal stripe 50 in one plane, and transparent electrode stripes 51, 52 and 53 in a parallel plane, further away from the semiconductor 50, and insulated from 50 by an interposed insulating film. The lines 54, 55 and 56 are the boundaries of chemically doped p-regions in a third parallel plane 69, namely, the surface of the underlying semiconducting body which is insulated from 50 by a second insulating film. These chemically doped p-regions connect to the p-regions induced by applying a negative bias to 51, 52 and 53 with respect to the semiconducting body. Similarly, there is a chemically doped n-layer of boundary 57 in the semiconducting body which connects to the n-layer induced in the semiconductor body by applying a positive bias voltage to the electrode 50 with respect to the semiconducting body. The contacts 61, 62, 63 connect to the p-layers in the semiconducting body and the contact 64 to the n-layer in that body. The contacts 65–67 connect to the transparent electrodes 51–53 of the inducing circuit and the contact 68 connects to the electrode 50 of the inducing circuit.

If the bias voltages applied to 50, 51, 52 and 53 are maintained for sufficiently long periods p-n junctions 58, 59 and 60 will be generated. However, we may apply the negative bias to 51, 52 or 53 only for such a short time that the induced p-type layer has no time to develop and the p-n junctions 58, 59 or 60 will not be activated, therefore. In the case, illumination of the region between 55 and 59 through the transparent electrode 52 can speed up the establishment of the n-layer under 52 and activate the p-n junction 59 during the brief period of application of bias to 52, while the other unilluminated junctions 58 and 60 will not be activated, i.e., the circuit in the semiconductor between the terminals 64 and 62 will be connected by a p-n junction 59, while the circuits between 64 and 61, or else 64 and 63 will remain open, the regions between 54 and 58 and 56 and 60 remaining insulating. Thus, by selective illumination of portions of the semiconductor surface scanned by a potential pattern as discussed in conjunction with FIG. 2, the p-n junction at illuminated positions can be activated, i.e., will have time to establish, while p-n junctions in unilluminated positions will not be activated. Thus the electric performance of the circuit encompassing the induced p-n junctions is indicative of the pattern of illumination.

Induced p- or n-conductivity layers on a semiconducting body may arise also without applying a potential to an external spaced electrode, namely, by space charges in an insulator covering the semiconducting body and/or interface charges between the semiconducting body and the insulator. Such induced conducting layers which may provide undesirable circuit paths can be removed as follows. The outer insulator surface is provided with a conducting layer to which a bias voltage is applied of such polarity and magnitude that the charge on this conducting layer is equal, but of opposite sign to the sum of the underlying insulator space charge and insulator-semiconductor interface charge.

FIGURE 5 illustrates a pertinent structure on hand of a cross section along the electrode 4 of FIG. 1, the cross section extending perpendicular to the interface between the semiconducting body 1 and the first insulating layer 3. The metal electrode 4, the second insulating layer 9, and the second metal electrode 10 are shown as is the contact 2 to the semiconducting body 1.

In addition to the structure of FIG. 1, there is a third insulating layer 70 covering the electrode 10. The upper surface of the insulating layer 70 is coated with a conducting film 71. The conducting film is biased against the semiconducting body in such a manner that the portion 72 of the semiconducting wafer surface, which is not adjacent to the electrode 4 or 10, does not contain any induced charge layer. The amount of bias voltage to 71 depends on the space charges in the insulators 3, 9 and 70 and the interface charges between 3 and 1.

The important parameter for inducing p- or n-layers in a semiconducting body is the electric field intensity at the semiconductor surface. Thus, the thicker the insulating film separating the inducing electrodes from the semiconductor, the larger the voltage required to produce an induced conductivity layer of a specified magnitude. In the case of a compensated semiconductor, i.e., a semiconductor containing equal concentrations of donor type and of acceptor type impurities, small electric fields cause space charge layers due to excess of charged donors over charged acceptors (or vice versa, depending on the polarity of the field), but sufficiently large fields attract holes (or else electrons) in sufficient concentration as to generate a p-layer (or else n-layer).

The calculation of the magnitude of the induced conductivity layer as function of the field intensity at the surface of the semiconductor, of the dopants in the semiconductor (specified by concentration and energy level) and of temperature is a mathematical exercise well known to those skilled in the art of semiconducting device design. Also well known to those skilled in the art, is the generation of electron-hole pairs by tunnel effect or else by avalanche breakdown effect once the electric field becomes sufficiently large.

High resistivity semiconducting materials by means of impurity compensation have been described repeatedly in the scientific literature. Since the requirement of a high resistivity semiconducting body may seem a rather vague specification, a few clarifying statements are in order. Ideally, we would wish to have an induced circuit path in the semiconducting body with zero leakage between the induced p- and n-regions and the rest of the semiconducting body. In practice, there will be a finite amount of such leakage and it becomes a question of the particular circuitry application how much of such leakage can be tolerated in a given case. In general, the higher the conductivity of the induced regions, the lower the bulk resistivity of the semiconducting body which can be tolerated. To obtain a high resistivity semiconducting body, we may (i) select a semiconducting material of large forbidden band gap, e.g., progress is sequence from Ge over Si, GaAs, GaP to SiC; (ii) improve the degree of compensation of donor and acceptor type chemical impurities or (iii) lower the operating temperature of the device.

The degree of isolation between an induced conductivity region and the bulk of the semiconducting body can be characterized by the difference of the so-called Fermi levels (with respect to the conduction band in case of n-layers, and with respect to valence band in case of p-layers) at the surface and in the bulk of the semiconductor in relation to the voltage equivalent of temperature, $kT/q$ where $k$ is the Boltzmann constant, T the absolute temperature and $q$ the electron charge. The voltage equivalent is about $\frac{1}{40}$ volt at room temperature. The Fermi level at the surface moves toward the conduction or else valence band with increasing induced n-, or else p-conduction. The Fermi level in the bulk of a dopant-free semiconductor lies about half-way between valence and conduction band. With the Fermi level lying at the boundary of the forbidden band at the surface of the semiconducting body, i.e., assuming a strong induced conductivity layer, and in the middle of the band in the bulk of the semiconducting body for a dopant-free intrinsic semiconductor, the resistive barrier separating the induced conducting region from the bulk of the semiconductor becomes about 0.4 volt for Ge, 0.55 volt for silicon, 0.65 volt for GaAs, 0.8 volt for GaP and 1.4 volts for SiC. For effective isolation a ratio of barrier height to $kT/q$ of at least 10, preferably 20 or more is desirable. Thus, the preferred materials for my invention are GaAs, GaP, $GaAs_xP_{1-x}$ alloys and SiC among the materials listed above.

Another reason for the preferance of these materials is their ability to emit visible light by carrier injection.

Another means to reduce leakage current consists in using a thin semiconducting body on an isolating supporting substrate, e.g., silicon on sapphire. The induced conductivity region may then extend through the semiconducting body to the substrate, reducing the contact area between the induced conductivity region and the high resistivity semiconducting body.

Insulating films can be deposited on the semiconducting body by a large number of well-known means, including high temperature oxidation in the case of silicon, chemical deposition of such materials as $Si_3N_4$ and $SiO_2$ by vapor reaction, electron beam evaporation of insulators, etc. Film thickness in the range between several hundred angstrom-units and a few tens of thousand angstrom-units has been found most useful. Electrodes for inducing the conducting regions in the semiconducting body include metal films, transparent contacts such as tin oxide and photoconductors such as CdS.

This invention has been illustrated by means of simple p-n junctions formed between induced charge layers. It is well known that several p-n junctions can be combined to more elaborate semiconducting devices, such as n-p-n-p rectifiers or n-p-n transistors, etc., and that these devices have electrical characteristics which are sensitive to illumination. It is also well known that p- and n-regions can be arranged in a large variety of patterns capable of performing numerous different circuit functions and generally known as microcircuits or integrated circuits. The scope of this invention is not restricted to the comparatively simple devices illustrated in the figures, but encompasses virtually the entire field of semiconducting circuitry as specified in the following claims; in which photoelectric element refers to either an electro-luminescent device or else a photo-detecting device, i.e., either an electrically activated light source or else an electric circuit element for registering incident radiation.

I claim:

1. A semiconducting device consisting of a high resistivity semiconducting material, a first electric circuit adjacent said semiconducting material, portions of said first electrical circuit electrically insulated from adjoining portions of said semiconducting material, a potential distribution between said first electric circuit and said semiconducting material so that at least one p-region and at least one n-region are induced in said semiconducting material resulting in at least one p-n junction between said induced p- and n-regions, means to connect said induced p-n junction in a second electric circuit, whereby said p-n junction becomes a photoelectric element.

2. A semiconducting device as described in claim 1 including means to change the potential distribution in said first electric circuit in such a manner that at least one induced p-n junction is shifted laterally along the surface of said semiconducting material.

3. A semiconducting device as described in claim 2, said means to change the potential distribution in said first electric circuit consisting of physical removal of said first electric circuit and replacement by a different circuit.

4. A semiconducting device as described in claim 2, said first semiconducting circuit consisting of a first set of laterally spaced contacts on an insulating layer covering an essentially planar surface of said semiconducting material and a second set of laterally spaced contacts insulated from said first set and from said semiconducting material, the normal projections of said first set and of said second set onto said essentially planar surface crossing each other, a p-n junction induced at the boundary between said projection of a contact of said first set and the projection of a contact of said second set by applying potentials of opposite polarity with respect to the semiconductor material to said contact of said first set and said contact of said second set, and means to shift said induced p-n junction by shifting the potential in sequence among the contacts of said first set and among the contacts of said second set, thereby scanning said essentially planar surface of said semiconducting body with an induced p-n junction.

5. A semiconducting device consisting of a high resistivity semiconducting material, a first electric circuit adjacent said semiconducting material, portions of said first electrical circuit electrically insulated from adjoining portions of said semiconducting material, a potential distribution between said first electric circuit and said semiconducting material so that at least one p-region and at least one n-region are induced in said semiconducting material resulting in at least one p-n junction between said induced p- and n-region in a second electric circuit, circuit elements capable of emitting radiation by electric activation and of electrically registering radiation in said first and said second electric circuits and photoelectric coupling of said first and second circuits by means of said radiation.

6. A semiconducting device consisting of a high resistivity semiconducting material, a first electric circuit adjacent said semiconducting material, portions of said first electrical circuit electrically insulated from adjoining portions of said semiconducting material, a potential distribution between said first electric circuit and said semiconducting material so that at least one p-region and at least one n-region are induced in said semiconducting material resulting in at least one p-n junction between said induced p- and n-regions, means to connect said induced p-n junction in a second electric circuit, a radiation sensitive electrical circuit element in said first electric circuit, means to modify the potential distribution of said first circuit by irradiation of said radiation sensitive element thereby affecting said induced p-n junction in said second electric circuit.

7. A semiconducting device consisting of a high resistivity semiconducting material, a first electric circuit adjacent said semiconducting material, portions of said first electrical circuit electrically insulated from adjoining portions of said semiconducting material, a potential distribution between said first electric circuit and said semiconducting material so that at least one p-region and at least one n-region are induced in said semiconducting material resulting in at least one p-n junction between said induced p- and n-regions, means to connect said induced p-n junction in a second electric circuit, means to change said potential distribution between said first electric circuit and said semiconducting body and means to modify the response of said second electric circuit to said change of potential distribution by illumination of said semiconducting material.

8. A device as specified in claim 1 including provisions to remove undesired conductivity regions induced by semiconductor surface charges and oxide space charges from portions of the semiconducting body by means of properly biased electrodes adjacent said portions and insulated from said portions.

References Cited

UNITED STATES PATENTS

| | | | |
|---|---|---|---|
| 3,059,115 | 10/1962 | Lempicki | 250—208 |
| 3,391,282 | 7/1968 | Kabell | 250—211 |
| 3,398,021 | 8/1968 | Lehrer et al. | 317—235-37 |

RALPH G. NILSON, Primary Examiner

C. M. LEEDOM, Assistant Examiner

U.S. Cl. X.R.

250—217; 307—311; 313—108; 317—235-27